US012808048B2

(12) United States Patent
Jang et al.

(10) Patent No.: US 12,808,048 B2
(45) Date of Patent: Nov. 24, 2026

(54) SHOWERHEAD ASSEMBLY AND SUBSTRATE PROCESSING APPARATUS

(71) Applicant: TES CO., LTD, Yongin-si (KR)

(72) Inventors: Kyung-Ho Jang, Yongin-si (KR); Byeong-Ho Yun, Yongin-si (KR); Min-Wook Kang, Yongin-si (KR)

(73) Assignee: TES CO., LTD., Yongin-si (KR)

( * ) Notice: Subject to any disclaimer, the term of this patent is extended or adjusted under 35 U.S.C. 154(b) by 587 days.

(21) Appl. No.: 18/227,277

(22) Filed: Jul. 27, 2023

(65) Prior Publication Data

US 2024/0042462 A1 Feb. 8, 2024

(30) Foreign Application Priority Data

Aug. 2, 2022 (KR) ........................ 10-2022-0095890

(51) Int. Cl.

*C23C 16/455* (2006.01)
*B05B 1/00* (2006.01)
*B05C 5/02* (2006.01)

(52) U.S. Cl.

CPC ............ *B05B 1/005* (2013.01); *B05C 5/0225* (2013.01); *B05C 5/0275* (2013.01); *C23C 16/45565* (2013.01); *C23C 16/4557* (2013.01)

(58) Field of Classification Search

None
See application file for complete search history.

(56) References Cited

U.S. PATENT DOCUMENTS

| | | | | |
|---|---|---|---|---|
| 5,449,410 | A * | 9/1995 | Chang | H01J 37/32862 118/723 ER |
| 2005/0183827 | A1 * | 8/2005 | White | C23C 16/45565 156/345.34 |
| 2009/0095334 | A1 * | 4/2009 | Huston | C23C 14/541 134/198 |
| 2015/0170912 | A1 * | 6/2015 | Ahmed | C23C 16/0227 118/719 |

FOREIGN PATENT DOCUMENTS

| | | | |
|---|---|---|---|
| KR | 10-2020-0020752 | A | 2/2020 |
| KR | 10-2020-0026305 | A | 3/2020 |
| KR | 10-2021-0016946 | A | 2/2021 |

* cited by examiner

*Primary Examiner* — Jason Berman

(74) *Attorney, Agent, or Firm* — Park, Kim & Suh, LLC

(57) ABSTRACT

The present disclosure relates to a showerhead assembly and a substrate processing apparatus, and more particularly to a showerhead assembly and a substrate processing apparatus including a ceramic heater that heats a substrate and by which hole processing is freely performed in a relatively high temperature process.

8 Claims, 5 Drawing Sheets

SHOWERHEAD ASSEMBLY AND SUBSTRATE PROCESSING APPARATUS

CROSS-REFERENCE TO RELATED APPLICATIONS

This application claims the benefit of Korean Patent Application No. 10-2022-0095890, filed on Aug. 2, 2022, which is hereby incorporated by reference as if fully set forth herein.

TECHNICAL FIELD

The present disclosure relates to a showerhead assembly and a substrate processing apparatus, and more particularly to a showerhead assembly and a substrate processing apparatus including a ceramic heater that heats a substrate and by which hole processing is freely performed in a relatively high temperature process.

BACKGROUND

A conventional substrate processing apparatus deposits a thin film having a predetermined thickness on one surface of a substrate, for example, an upper surface of the substrate. In this case, like a 3d-Nand device, when thin films are stacked on a substrate in a plurality of layers, the substrate may be bowed.

When a bowing phenomenon of the substrate occurs, it may be difficult to perform a process at an accurate position of the substrate in a subsequent step, and it may be difficult to chuck the substrate. In particular, a substrate processing process is performed with very high precision, and the bowing phenomenon of the substrate may decrease the precision of the substrate processing process.

In order to alleviate or eliminate the aforementioned bowing phenomenon of the substrate, a technology of depositing a thin film on a lower surface of the substrate is currently developed.

As such, in order to deposit a thin film on the lower surface of the substrate, an edge of the substrate is supported and process gas is supplied from the lower surface of the substrate. Therefore, in this configuration, it is difficult to heat the substrate from a lower portion of the substrate when heating the substrate to correspond to a processing temperature of the substrate.

Conventionally, a metal heater is employed on an upper portion of a substrate. In this case, although hole processing for supply of process gas is free, there is a disadvantage in that it is difficult to cope with a high-temperature environment, such as damage to a part due to expansion of a heater, when the process temperature rises.

In addition, when a ceramic heater is used on an upper portion of a substrate to cope with a high-temperature process, this may be used in a high-temperature process, but it is disadvantageously difficult to process a hole for supplying process gas.

SUMMARY

The present disclosure is to provide a showerhead assembly and a substrate processing apparatus that easily supply a process even in a relatively high process in a showerhead assembly including a heater body made of a ceramic material heating a substrate at an upper portion of the substrate.

The present disclosure provides a showerhead assembly provided at an upper portion of a chamber including a heater body configured to heat a substrate, including a plurality of supply holes supplying at least one process gas toward the substrate, and made of ceramic, and an airtight unit configured to seal a space between the heater body and an upper end of the chamber.

The airtight unit may include a shutter provided on an upper surface of an edge of the heater body, a shutter ring configured to pressurize the shutter, and an elastic pressurizer configured to elastically pressurize the shutter ring and disposed at an upper portion of the chamber.

The shutter may be disposed on an upper surface of the heater body and the upper surface of the heater body may face a lid of the chamber.

The shutter may protrude from the edge of the heater body by a predetermined length.

A through hole through which a process gas passes may be formed on at least one of the shutter or the shutter ring.

The present disclosure provides a substrate processing apparatus including a chamber providing a processing space in which a substrate is processed, a first showerhead assembly provided inside the chamber, having the substrate accommodated thereon, and supplying at least one or more first process gases toward a lower surface of the substrate, and a second showerhead assembly provided at an upper portion of the substrate to heat the substrate and supplying at least one or more second portion process gases toward an upper surface of the substrate, wherein the second showerhead assembly includes a heater body that heats the substrate, includes a plurality of supply holes through which at least one or more process gases are supplied toward the substrate, and is made of ceramic, and an airtight unit configured to seal a space between the heater body and an upper end of the chamber.

A stem protruding upward is formed on the heater body and an opening through which the stem passes may be formed in a lid of the chamber, and at least one second process gas may be supplied through at least one of a space between the stem and the opening or a supply hole formed through the chamber.

The airtight unit may include a shutter disposed on an upper surface of an edge of the heater body, a shutter ring configured to pressurize the shutter downward, and an elastic pressurizer configured to elastically pressurize the shutter ring downward and disposed at an upper portion of the chamber.

The elastic pressurizer may include a sealer, and a heat exchange flow path through which a heat exchange fluid flows may be formed on the lid adjacent to the sealer According to the present disclosure having the aforementioned configuration, a heater body of a ceramic material heating a substrate at an upper portion of the substrate may be provided to easily perform a process even in a relatively high temperature process.

Furthermore, processing of the heater body may be minimized by utilizing a space between an upper surface of the heater body and a lower surface of a lid as a diffusion space in which process gas is supplied.

DETAILED DESCRIPTION

Hereinafter, the structure of a showerhead assembly according to an embodiment of the present disclosure will be described in detail with reference to the drawings.

Figure 1:
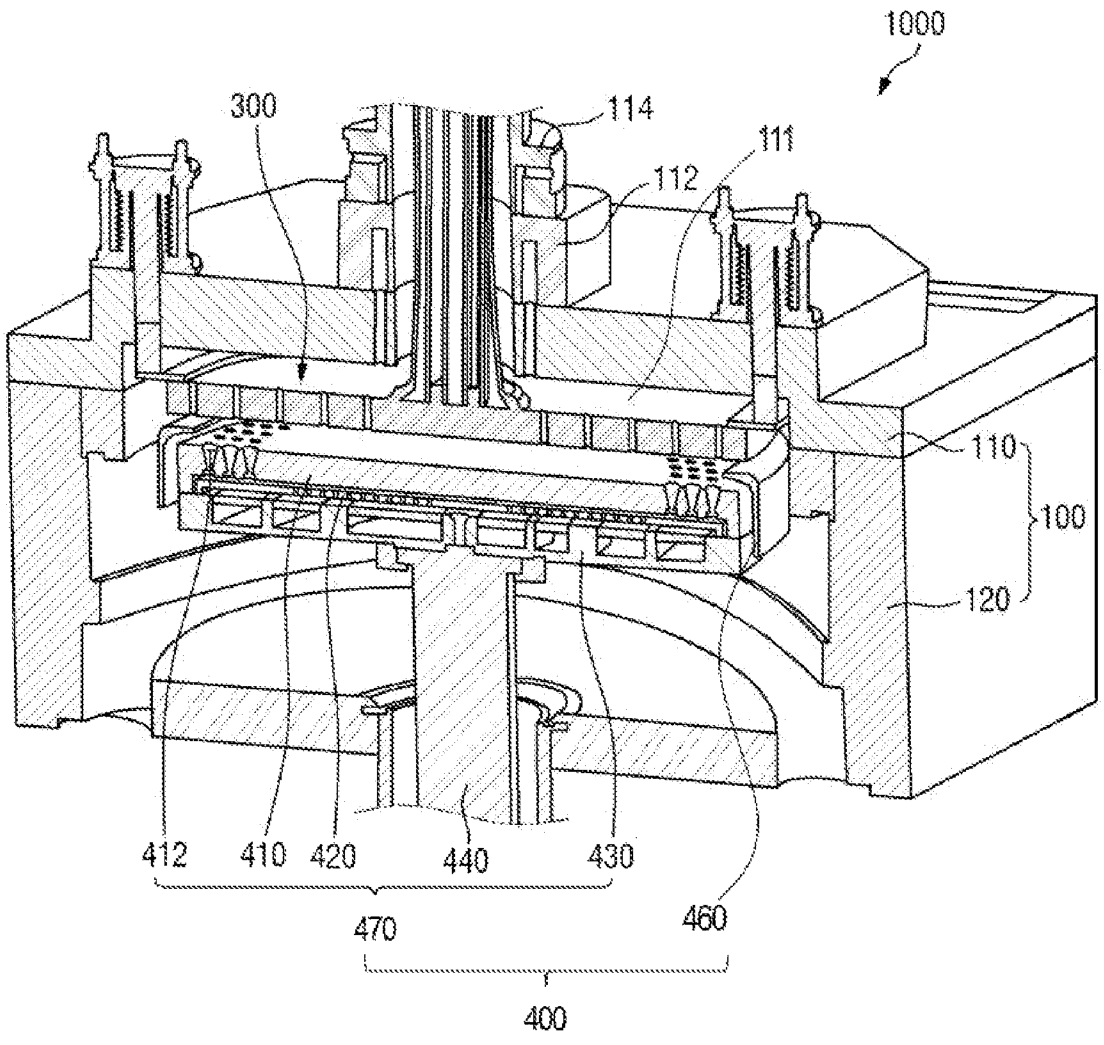
FIG. 1 is a cross-sectional perspective view showing a chamber of a substrate processing apparatus having a showerhead assembly according to an embodiment of the present disclosure.
Figure 2:
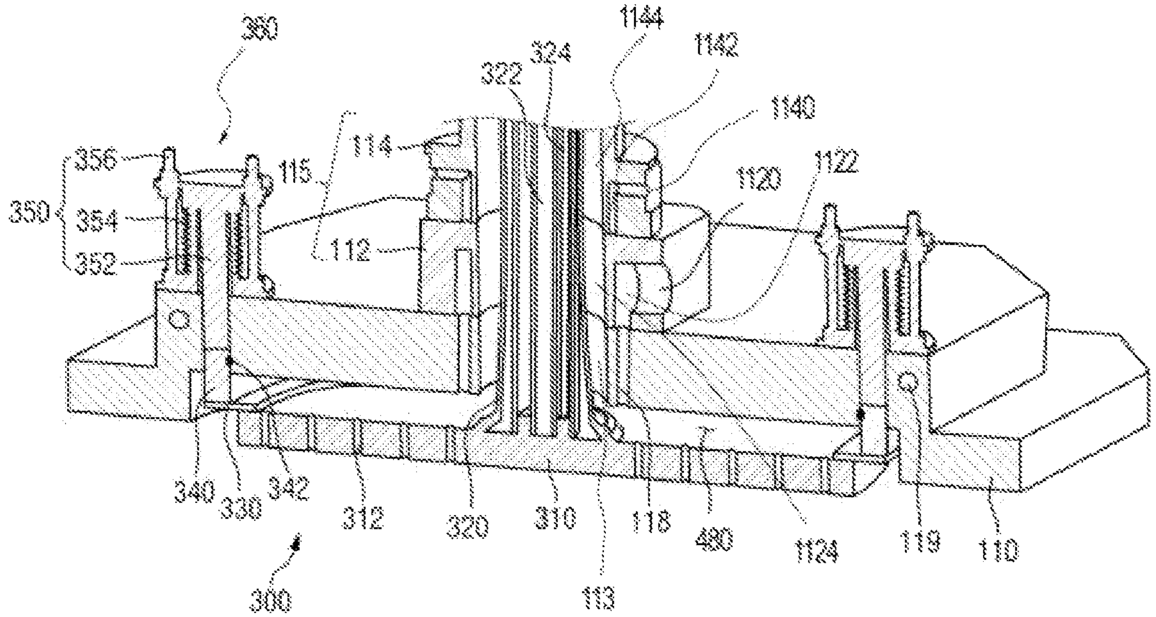
FIG. 2 is a cross-sectional perspective view showing a lid and a showerhead assembly.

FIG. 1 is a cross-sectional perspective view showing a chamber 100 of a substrate processing apparatus 1000 having a showerhead assembly 300 according to an embodiment of the present disclosure, and FIG. 2 is a cross-sectional perspective view showing the showerhead assembly 300 connected to a lid 110.

Referring to FIGS. 1 and 2, the substrate processing apparatus 1000 may include the chamber 100 that provides a processing space 111 in which a substrate (not shown) is processed, a first showerhead assembly 400 provided in the chamber 100, having the substrate accommodated thereon, and supplying at least one first process gas toward a lower surface of the substrate, and the second showerhead assembly 300 provided on an upper portion of the substrate to heat the substrate and supplying at least one second process gas toward an upper surface of the substrate.

The substrate processing apparatus 1000 according to the present disclosure may deposit a thin film by supplying a first process gas to the lower surface of the substrate using the first showerhead assembly 400, and furthermore, may supply a second process gas such as cleaning gas or purge gas to the upper surface of the substrate using the second showerhead assembly 300.

First, the chamber 100 may provide the processing space 111 for processing the substrate inside. The chamber 100 may include a chamber body 120 having an open top and a lid 110 sealing the open top of the chamber body 120.

The first showerhead assembly 400 described above is provided in a lower portion of the inside of the chamber 100. The first showerhead assembly 400 may support the substrate and supply the aforementioned first process gas to the lower surface of the substrate.

Specifically, the first showerhead assembly 400 may include a substrate support 460 supporting an edge of the substrate and a first showerhead 470 disposed inside the substrate support 460 and supplying the first process gas toward the lower surface of the substrate.

The substrate support 460 supports an edge of the lower surface of the substrate such that a thin film may be deposited on the lower surface of the substrate.

The first showerhead 470 may include a first supply hole 412 supplying the first process gas toward the substrate and a support bar 440 extending downward. A supply flow path (not shown) through which the first process gas is supplied may be formed through the inside of the support bar 440. That is, the first process gas supplied through the supply flow path is supplied toward the lower surface of the substrate through the first supply hole 412.

For example, the first showerhead 470 includes a lower plate 430 connected to the support bar 440, a buffer plate 420 located on an upper portion of the lower plate 430, and a facing plate 410 that is located on an upper portion of the buffer plate 420 and in which the first supply hole 412 is formed.

The first process gas may be uniformly distributed from the buffer plate 420 through the lower plate 430 and supplied through the first supply hole 412 of the facing plate 410.

The structure of the first showerhead 470 is only described as an example and may be appropriately modified.

As described above, in order to deposit a thin film on the lower surface of the substrate, the edge of the substrate is supported by the substrate support 460, and a process gas is supplied from the lower surface of the substrate. Therefore, in this configuration, when heating the substrate to adjust a process temperature for the substrate, it is difficult to heat the substrate from the lower portion of the substrate.

Therefore, in the present disclosure, the second showerhead assembly 300 is provided on the upper portion of the substrate to heat the substrate and supply at least one second process gas toward the upper surface of the substrate. In addition, the second showerhead assembly 300 may supply purge gas, curtain gas, or cleaning gas toward the upper surface of the substrate.

However, conventionally, a metal heater is employed on the upper portion of the substrate. In this case, hole processing for supply of process gas is free, but there is a disadvantage that it is difficult to cope with a high-temperature environment when the process temperature rises.

When a ceramic heater is used on the upper portion of the substrate to cope with the high temperature process, this may be used in the high temperature process, but it has a disadvantage that it is difficult to process a hole for supplying the process gas.

In order to resolve this problem, the present disclosure provides the second showerhead assembly 300 to be used even in a high-temperature process of depositing a thin film on the lower surface of the substrate.

Referring to FIG. 2, the second showerhead assembly 300 may include a heater body 310 that heats the substrate, includes a plurality of second supply holes 312 formed therein to supply at least one process gases toward the substrate, and is made of ceramic, and an airtight unit 360 that seals a space between the heater body 310 and an upper end of the chamber 100. For example, the airtight unit 360 may seal a space between the heater body 310 and a lid 110 of the chamber 100.

The heater body 310 may be made of ceramic to correspond to a high-temperature process environment. The plurality of second supply holes 312 supplying a second process gas toward an upper portion of the substrate may be formed in the heater body 310. The second supply holes 312 may pass through the heater body 310 and be formed in a vertical direction.

As described above, it may be difficult to form a hole for forming a flow path of a process gas in the heater body 310 made of ceramic, in particular, a horizontal hole inside the heater body 310.

Thus, according to the present disclosure, the space between the heater body 310 and the upper end of the chamber 100, for example, the space between the heater body 310 and the lid 110 may be used as a diffusion space 480 to which the process gas is supplied. In more detail, the process gas may flow into the diffusion space 480 between an upper surface of the heater body 310 and a lower surface of the lid 110 and may be supplied downward through the second supply holes 312 of the heater body 310.

The process gas supplied to the diffusion space 480 may be provided through the lid 110 of the chamber 100.

For example, a stem 320 protruding upward may be formed on the heater body 310, and a lid opening 113 through which the stem 320 passes may be formed in the lid 110 of the chamber 100.

An RF load 322 applying RF power to the heater body 310 when a process using plasma for the substrate is performed, and a detector 324 detecting a temperature of the heater body 310 may be connected to the inside of the stem 320.

In the above configuration, the second process gas may be supplied through at least one of the space between the stem 320 and the lid opening 113 and a through hole 118 formed through the lid 110.

For example, a gas supply head 115 supplying a process gas may be disposed on an upper surface of the lid 110. A first opening 1144 and a second opening 1124 through which the aforementioned stem 320 passes may each be formed in the gas supply head 115, and various flow paths for supplying a process gas may be formed inside the gas supply head 115.

In this case, at least one second process gas may flow into the gas supply head 115 and may be supplied toward the heater body 310.

The gas supply head 115 may include a first head 114 to which a $(2\text{-}1)^{th}$ process gas flows and is supplied, and a second head 112 to which a $(2\text{-}2)^{th}$ process gas flows and is supplied. The first head 114 and the second head 112 are shown as assembled and manufactured as separate members, but may be integrally configured.

The second head 112 may be disposed on the upper surface of the lid 110, and the first head 114 may be disposed on an upper portion of the second head 112.

A first inlet 1140 into which the $(2\text{-}1)^{th}$ process gas flows and a first connection flow path 1142 through which the $(2\text{-}1)^{th}$ process gas flows may be formed in the first head 114. In this case, the first connection flow path 1142 may communicate with the first opening 1144 of the first head 114.

That is, the $(2\text{-}1)^{th}$ process gas may be supplied to the inside of the first head 114 through the first inlet 1140, supplied to the first opening 1144 through the first connection flow path 1142, and supplied to the aforementioned diffusion space 480 through the lid opening 113 of the lid 110.

A second inlet 1120 into which the $(2\text{-}2)^{th}$ process gas flows and a second connection flow path 1122 along which the $(2\text{-}2)^{th}$ process gas flows may be formed in the second head 112. In this case, the second connection flow path 1122 may communicate with the through hole 118 of the lid 110.

That is, the $(2\text{-}2)^{th}$ process gas may be supplied to the inside of the second head 112 through the second inlet 1120, supplied to the through hole 118 through the second connection flow path 1122, and supplied to the aforementioned diffusion space 480 through the through hole 118.

For example, the aforementioned $(2\text{-}1)^{th}$ process gas may be purge gas including Ar and $N_2$, and the $(2\text{-}2)^{th}$ process gas may be cleaning gas including $NF_3$. Needless to say, a type of these process gases are only described as an example and may be appropriately adjusted.

As described above, when a process gas is supplied to the diffusion space 480, it may be important to seal the diffusion space 480 to supply the process gas of the diffusion space 480 downward through the second supply holes 312 of the heater body 310.

According to the present disclosure, the airtight unit 360 may be provided to seal the diffusion space 480 between the heater body 310 and the lid 110 of the chamber 100.

Figure 3:
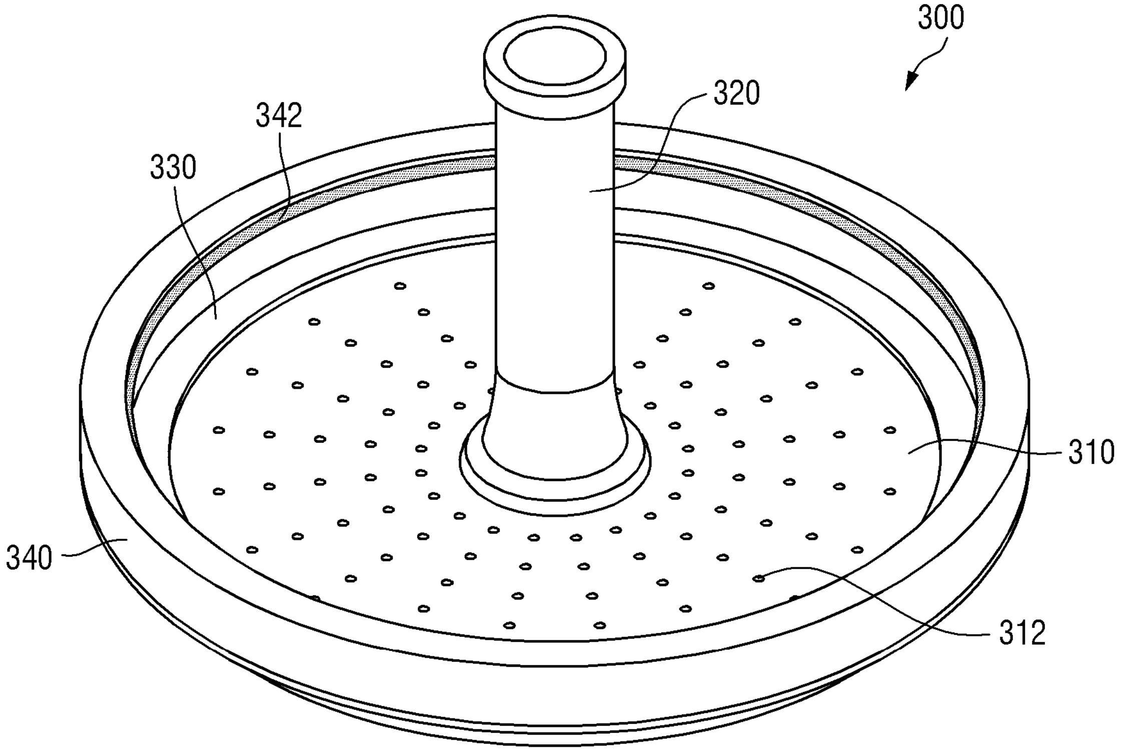
FIG. 3 is an upper perspective view of a showerhead assembly.
Figure 4:
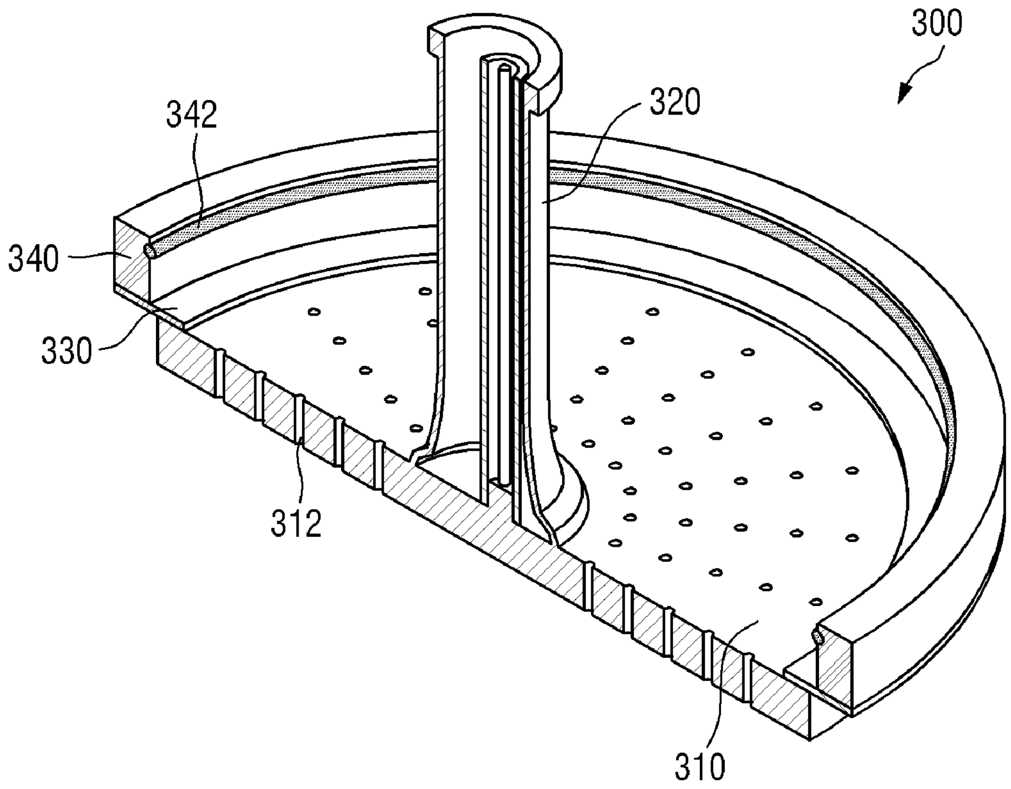
FIG. 4 is a cross-sectional perspective view of a showerhead assembly.

FIG. 3 is a perspective view of an upper portion of the showerhead assembly 300, and FIG. 4 is a cross-sectional perspective view of the showerhead assembly 300.

Referring to FIGS. 2 to 4, the airtight unit 360 is configured to seal the diffusion space 480 even when the heater body 310 thermally expands in a relatively high temperature process.

Specifically, the airtight unit 360 may include a shutter 330 provided on an upper surface of an edge of the heater body 310, a shutter ring 340 that pressurizes the shutter 330 downward, and an elastic pressurizer 350 that elastically pressurizes the shutter ring 340 downward and provided on the lid 110.

The shutter 330 may be manufactured to correspond to a shape of the heater body 310 described above. For example, the shutter 330 may be manufactured in a circular shape and have an opening formed in the center thereof. The second supply holes 312 of the heater body 310 communicates with the diffusion space 480 through an opening in the center of the shutter 330.

An outer diameter of the shutter 330 may be larger than an outer diameter of the heater body 310. When the outer diameter of the shutter 330 is smaller than that of the heater body 310, the shutter 330 may cover the second supply holes 312 of the heater body 310, and in particular, the shutter 330 may further cover the second supply holes 312 of the heater body 310 when the heater body 310 thermally expands due to the process temperature.

The shutter 330 may be pressurized downward by the aforementioned shutter ring 340, and thus a lower surface of the shutter 330 comes into contact with an upper surface of an edge of the heater body 310. That is, the shutter 330 is pressurized toward the heater body 310 by the shutter ring 340 and the diffusion space 480 is sealed by the shutter ring 340 and the shutter 330.

The shutter ring 340 may be manufactured to correspond to a shape of the heater body 310 described above. For example, the shutter ring 340 may have a circular shape with an opening formed in the center thereof.

In this case, the shutter ring 340 may include a sealer 342. For example, as shown in the drawing, the sealer 342 such as an O-ring may be provided inside the shutter ring 340 to seal the diffusion space 480 more effectively.

As such, when the shutter ring 340 includes the sealer 342, if the sealer 342 is heated to be damaged or broken due to a process temperature of the chamber 100, sealing of the diffusion space 480 may be broken. To prevent this, a heat exchange flow path 119 through which a heat exchange fluid flows may be formed in the lid 110 adjacent to the sealer 342. The heat exchange flow path 119 may maintain the temperature of the sealer 342 below a predetermined temperature to prevent damage or breakage of the sealer 342.

The shutter ring 340 may be pressurized downward by the elastic pressurizer 350. The elastic pressurizer 350 elastically pressurizes the shutter ring 340 downward. Here, the meaning of 'elastically pressurizing' may be interpreted as allowing fine vertical movement of the shutter ring 340 even while pressurizing the shutter ring 340 downward by the elastic pressurizer 350.

For example, when the heater body 310 thermally expands, the heater body 310 may expand in a vertical direction. When the heater body 310 expands in a vertical direction, if the shutter ring 340 continues to pressurize the shutter 330 downward, damage may occur to the shutter 330 and the shutter ring 340. In order to prevent this, in the present disclosure, the shutter ring 340 is elastically pressurized by the elastic pressurizer 350.

When the heater body 310 thermally expands in a horizontal direction, an edge of the heater body 310 may still be positioned below the shutter 330 to maintain a sealing state of the diffusion space 480.

The aforementioned elastic pressurizer 350 may be configured in two or more, and a specific number is not limited.

The configuration of the elastic pressurizer 350 may be implemented in various ways. For example, the elastic pressurizer 350 may include a support bar 356 fixed to the lid 110, an elastic member 354 fixed to the support bar 356 and applying elastic force downward, and a pressurizing bar 352 that is connected to the elastic member 354, extends downward, and is connected to the shutter ring 340.

The elastic member 354 may be implemented in various ways, such as a bellows or a spring. In addition, although not shown in the drawing, when the elastic member 354 includes a bellows, it is possible to additionally include a spring or the like to reinforce elastic force.

In a state in which the support bar 356 is fixed to one end of the elastic member 354, the pressurizing bar 352 may apply elastic force downward to the shutter ring 340 by the elastic member 354.

Figure 5:
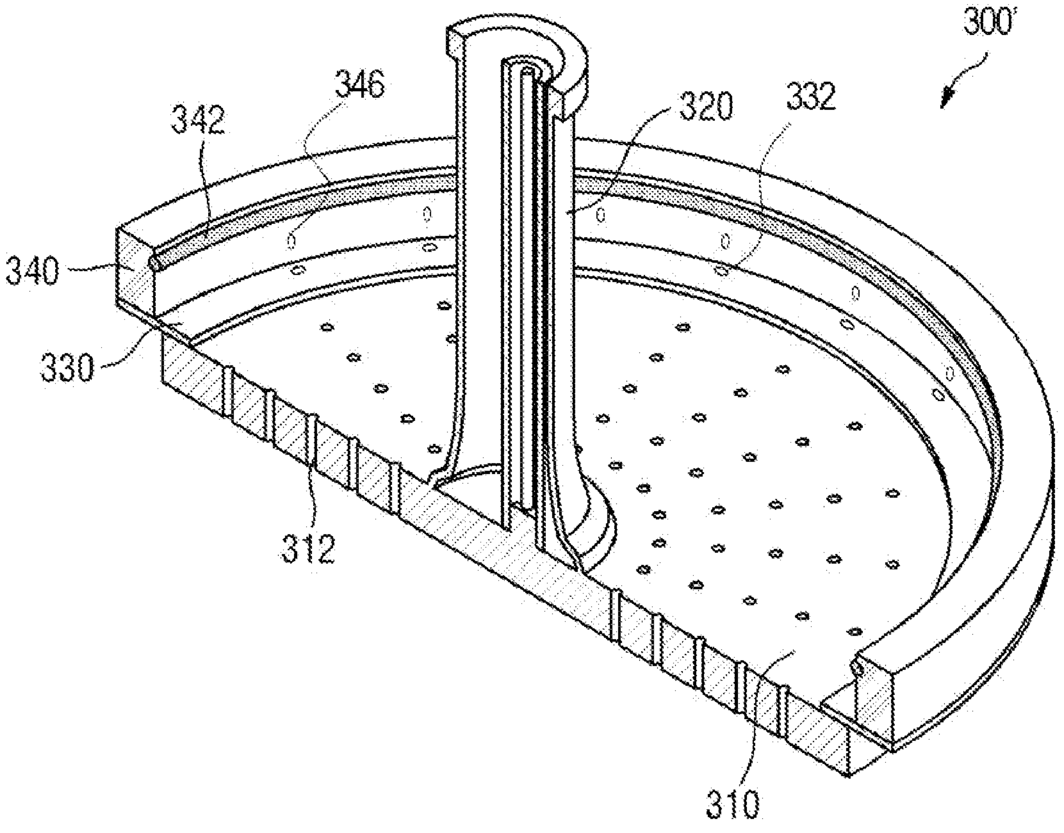
FIG. 5 is a cross-sectional view showing a showerhead assembly according to another embodiment.

FIG. 5 shows a showerhead assembly 300' according to another embodiment.

Referring to FIG. 5, the showerhead assembly 300' may include the through holes 332 and 346 formed therein to allow a process gas to pass through at least one of the shutter 330 or the shutter ring 340.

When the through holes 332 and 346 are formed on at least one of the shutter 330 or the shutter ring 340, if purge gas is supplied to the diffusion space 480, the purge gas may be supplied downward through the through holes 332 and 346.

In this case, the shutter 330 and the shutter ring 340 are disposed at a side of an edge of the heater body 310, and thus purge gas supplied downward through the through holes 332 and 346 may be supplied to a side of an edge of a substrate at a lower side and may serve as a so-called 'curtain gas'. Accordingly, the first process gas supplied by the first showerhead assembly 400 may be prevented from being supplied to the upper surface of the substrate.

Although the present disclosure has been described with reference to an exemplary embodiment, those skilled in the art may make various modifications and changes within the scope without departing from the spirit and the scope of the present disclosure described in the claims described below. Therefore, when the modified implementation basically includes the elements of the claims of the present disclosure, the modified implementation needs to be considered as being included in the technical scope of the present disclosure.

What is claimed is:

1. A showerhead assembly, comprising:

a chamber lid;

a heater body configured to heat a substrate and made of ceramic, the heater body including a plurality of supply holes supplying at least one process gas toward the substrate; and an airtight unit coupled to the chamber lid and the heater body, wherein the airtight unit comprises:

a shutter disposed on an upper surface of an edge of the heater body;

a shutter ring disposed on an upper surface of an edge of the shutter and pressing the shutter downward, wherein the shutter and the shutter ring seal a diffusion space formed above the heater body and below the chamber lid; and an elastic pressurizer fixed to the chamber lid and pressing the shutter ring downward to securely seal the diffusion space.

2. The showerhead assembly of claim 1, wherein an outer diameter of the shutter is greater than a diameter of the heater body by a predetermined length.

3. The showerhead assembly of claim 1, wherein at least one through hole through which a process gas passes is formed on at least one of the shutter and the shutter ring.

4. A substrate processing apparatus comprising:

a chamber providing a processing space in which a substrate is processed;

a first showerhead assembly provided inside the chamber, having the substrate accommodated thereon, and supplying at least one or more first process gases toward a lower surface of the substrate; and a second showerhead assembly provided at an upper portion of the substrate to heat the substrate and supplying at least one or more second process gases toward an upper surface of the substrate, wherein the second showerhead assembly includes a heater body that heats the substrate, includes a plurality of supply holes through which at least one or more process gases are supplied toward the substrate, and is made of ceramic, and an airtight unit, wherein the airtight unit includes:

a shutter disposed on an upper surface of an edge of the heater body;

a shutter ring disposed on an upper surface of an edge of the shutter and pressing the shutter downward, wherein the shutter and the shutter ring seal a diffusion spaced formed above the heater body and below a lid of the chamber; and an elastic pressurizer fixed to the lid of the chamber and pressing the shutter ring downward in order to seal the diffusion space.

5. The substrate processing apparatus of claim 4, wherein a stem protruding upward is configured on the heater body and an opening through which the stem passes is formed in the lid of the chamber, and at least one second process gas is supplied through at least one of a space between the stem and the opening or a supply hole formed through the chamber.

6. The substrate processing apparatus of claim 4, wherein the elastic pressurizer includes a sealer, and a heat exchange flow path through which a heat exchange fluid flows is formed on the lid of the chamber adjacent to the sealer.

7. The showerhead assembly of claim 1, wherein the elastic pressurizer comprises:

a support bar fixed to the chamber lid;

a pressurizing bar pressing the shutter ring downward; and an elastic member coupled between the support bar and the pressurizing bar and applying an elastic downward force on the pressurizing bar.

8. The substrate processing apparatus of claim 4, wherein the elastic pressurizer comprises:

a support bar fixed to the lid of the chamber;

a pressurizing bar pressing the shutter ring downward; and an elastic member coupled between the support bar and the pressuring bar and applying an elastic downward force on the pressurizing bar.

* * * * *